United States Patent
Hayakawa

(10) Patent No.: US 8,674,979 B2
(45) Date of Patent: Mar. 18, 2014

(54) DRIVER CIRCUIT, DISPLAY DEVICE INCLUDING THE DRIVER CIRCUIT, AND ELECTRONIC DEVICE INCLUDING THE DISPLAY DEVICE

(75) Inventor: Masahiko Hayakawa, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 642 days.

(21) Appl. No.: 12/912,059

(22) Filed: Oct. 26, 2010

(65) Prior Publication Data

US 2011/0102409 A1    May 5, 2011

(30) Foreign Application Priority Data

Oct. 30, 2009   (JP) ................. 2009-249631

(51) Int. Cl.
   *G06F 3/041*         (2006.01)
(52) U.S. Cl.
   USPC ........................................................ 345/214
(58) Field of Classification Search
   USPC ............ 345/156, 173–184; 178/18.04–20.01
   See application file for complete search history.

(56) References Cited

U.S. PATENT DOCUMENTS

| | | |
|---|---|---|
| 4,571,584 A | 2/1986 | Suzuki |
| 4,591,848 A | 5/1986 | Morozumi et al. |
| 4,769,639 A | 9/1988 | Kawamura et al. |
| 4,922,240 A | 5/1990 | Duwaer |
| 5,132,819 A | 7/1992 | Noriyama et al. |
| 5,159,260 A | 10/1992 | Yoh et al. |
| 5,250,931 A | 10/1993 | Misawa et al. |
| 5,365,250 A | 11/1994 | Hirashima |
| 5,457,474 A | 10/1995 | Ikeda |
| 5,477,073 A | 12/1995 | Wakai et al. |

(Continued)

FOREIGN PATENT DOCUMENTS

| | | |
|---|---|---|
| EP | 1737044 A | 12/2006 |
| EP | 1895545 A | 3/2008 |

(Continued)

OTHER PUBLICATIONS

Park et al., "Threshold voltage control in dual gate ZnO-based thin film transistors," IMID '09 Digest, 2009, pp. 527-530.

(Continued)

*Primary Examiner* — Srilakshmi K Kumar
*Assistant Examiner* — Damon Treitler
(74) *Attorney, Agent, or Firm* — Eric J. Robinson; Robinson Intellectual Property Law Office, P.C.

(57) ABSTRACT

One object is, when a thin film transistor whose channel is formed using an amorphous semiconductor is used for a driver circuit formed using only n-channel transistors or p-channel transistors, to provide a driver circuit in which the threshold voltage is compensated in accordance with the degree of change in the threshold voltage. In the driver circuit which includes a unipolar transistor including a first gate and a second gate which are disposed above and below a semiconductor layer with insulating layers provided therebetween, a first signal for controlling switching of the transistor is inputted to the first gate, a second signal for controlling a threshold voltage of the transistor is inputted to the second gate, and the second signal is controlled in accordance with a value of current consumption including a current which flows between a source and a drain of the transistor.

22 Claims, 11 Drawing Sheets

(56) References Cited

U.S. PATENT DOCUMENTS

| | | | |
|---|---|---|---|
| 5,559,526 A | 9/1996 | Izawa | |
| 5,567,959 A | 10/1996 | Mineji | |
| 5,570,105 A | 10/1996 | Koyama | |
| 5,574,474 A | 11/1996 | Tamanoi | |
| 5,574,475 A | 11/1996 | Callahan et al. | |
| 5,644,147 A | 7/1997 | Yamazaki et al. | |
| 5,646,643 A | 7/1997 | Hirai et al. | |
| 5,663,918 A | 9/1997 | Javanifard et al. | |
| 5,666,133 A | 9/1997 | Matsuo et al. | |
| 5,680,149 A | 10/1997 | Koyama et al. | |
| 5,689,280 A | 11/1997 | Asari et al. | |
| 5,712,652 A | 1/1998 | Sato et al. | |
| 5,731,856 A | 3/1998 | Kim et al. | |
| 5,744,864 A | 4/1998 | Cillessen et al. | |
| 5,807,772 A | 9/1998 | Takemura | |
| 5,808,595 A | 9/1998 | Kubota et al. | |
| 5,814,834 A | 9/1998 | Yamazaki et al. | |
| 5,818,070 A | 10/1998 | Yamazaki et al. | |
| 5,821,137 A | 10/1998 | Wakai et al. | |
| 5,834,797 A | 11/1998 | Yamanaka | |
| 5,899,547 A | 5/1999 | Yamazaki et al. | |
| 5,917,199 A | 6/1999 | Byun et al. | |
| 5,917,221 A | 6/1999 | Takemura | |
| 5,929,527 A | 7/1999 | Yamazaki et al. | |
| 5,956,011 A | 9/1999 | Koyama et al. | |
| 6,010,923 A | 1/2000 | Jinno | |
| 6,037,924 A | 3/2000 | Koyama et al. | |
| 6,072,193 A | 6/2000 | Ohnuma et al. | |
| 6,081,131 A | 6/2000 | Ishii | |
| 6,150,283 A | 11/2000 | Ishiguro | |
| 6,153,893 A | 11/2000 | Inoue et al. | |
| 6,197,624 B1 | 3/2001 | Yamazaki | |
| 6,198,133 B1 | 3/2001 | Yamazaki et al. | |
| 6,204,519 B1 | 3/2001 | Yamazaki et al. | |
| 6,207,971 B1 | 3/2001 | Jinno et al. | |
| 6,215,154 B1 | 4/2001 | Ishida et al. | |
| 6,294,274 B1 | 9/2001 | Kawazoe et al. | |
| 6,380,011 B1 | 4/2002 | Yamazaki et al. | |
| 6,392,628 B1 | 5/2002 | Yamazaki et al. | |
| 6,396,078 B1 | 5/2002 | Uochi et al. | |
| 6,462,723 B1 * | 10/2002 | Yamazaki et al. | 345/82 |
| 6,512,271 B1 | 1/2003 | Yamazaki et al. | |
| 6,563,174 B2 | 5/2003 | Kawasaki et al. | |
| 6,569,716 B1 | 5/2003 | Suzuki | |
| 6,603,453 B2 | 8/2003 | Yamazaki et al. | |
| 6,608,613 B2 | 8/2003 | Koyama et al. | |
| 6,727,522 B1 | 4/2004 | Kawasaki et al. | |
| 6,960,787 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,202,863 B2 | 4/2007 | Kimura et al. | |
| 7,211,825 B2 | 5/2007 | Shih et al | |
| 7,247,882 B2 | 7/2007 | Yamazaki et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,786,985 B2 | 8/2010 | Kimura et al. | |
| 7,859,510 B2 | 12/2010 | Umezaki | |
| 8,044,906 B2 | 10/2011 | Kimura et al. | |
| 8,054,279 B2 | 11/2011 | Umezaki et al. | |
| 8,059,078 B2 | 11/2011 | Kimura et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0158929 A1 | 7/2005 | Yamazaki et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0102313 A1 | 4/2010 | Miyairi et al. | |
| 2010/0102314 A1 | 4/2010 | Miyairi et al. | |
| 2010/0109002 A1 | 5/2010 | Itagaki et al. | |
| 2010/0117079 A1 | 5/2010 | Miyairi et al. | |
| 2011/0187694 A1 | 8/2011 | Umezaki | |
| 2012/0032943 A1 | 2/2012 | Kimura et al. | |

(56) References Cited

U.S. PATENT DOCUMENTS

| | | |
|---|---|---|
| 2012/0049184 A1 | 3/2012 | Umezaki et al. |
| 2012/0056860 A1 | 3/2012 | Umezaki et al. |
| 2012/0068173 A1 | 3/2012 | Umezaki |

FOREIGN PATENT DOCUMENTS

| | | |
|---|---|---|
| EP | 1906414 A | 4/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-222256 A | 8/2004 |
| JP | 2004-273614 A | 9/2004 |
| JP | 2004-273732 A | 9/2004 |
| JP | 2005-251348 | 9/2005 |
| JP | 2006-237624 | 9/2006 |
| JP | 2008-083692 A | 4/2008 |
| JP | 2008-089915 A | 4/2008 |
| JP | 2009-094927 | 4/2009 |
| JP | 2009-251205 | 10/2009 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,". SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 58, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGeO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/067814) Dated Nov. 2, 2010.

Written Opinion (Application No. PCT/JP2010/067814) Dated Nov. 2, 2010.

* cited by examiner

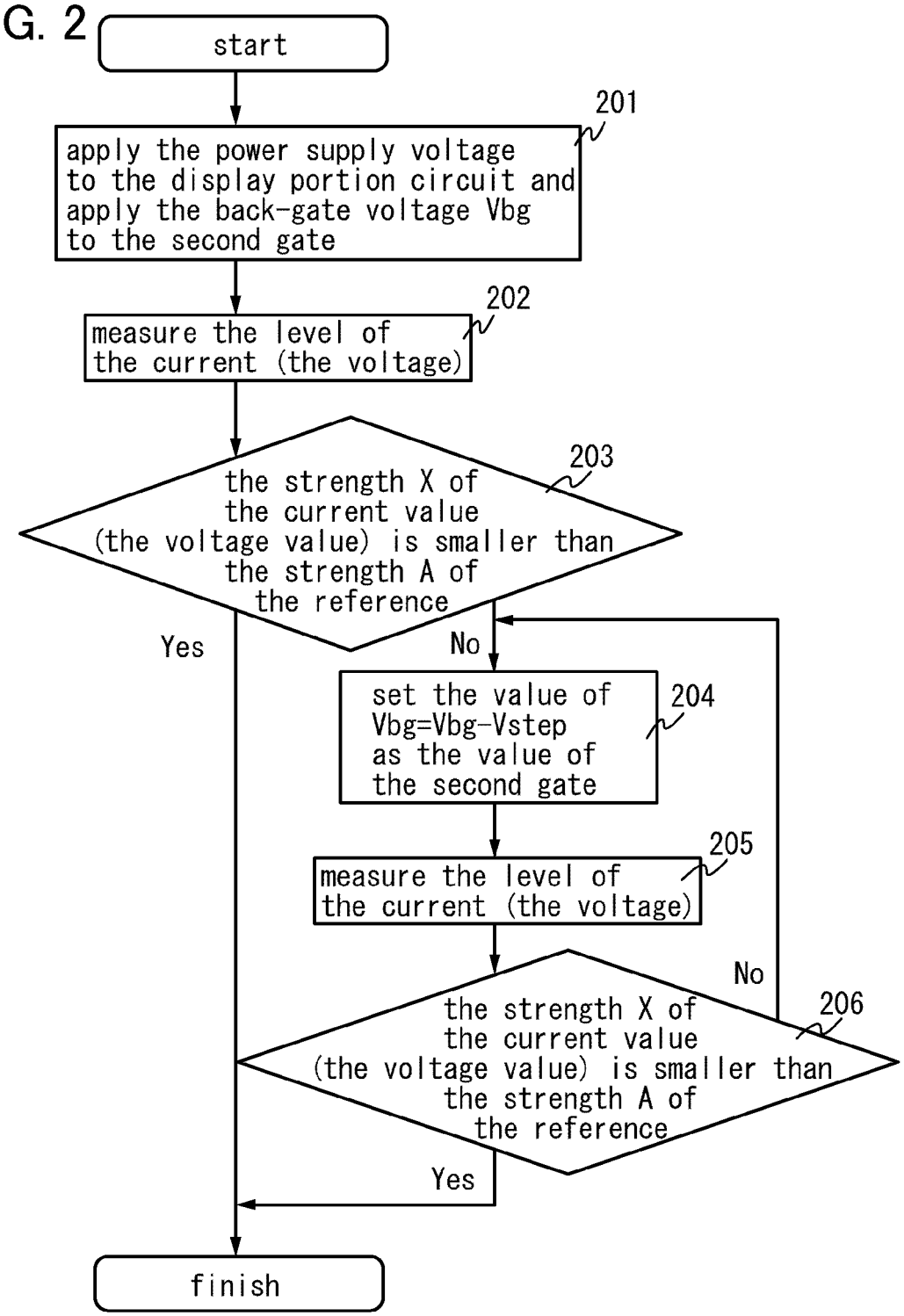

DRIVER CIRCUIT, DISPLAY DEVICE INCLUDING THE DRIVER CIRCUIT, AND ELECTRONIC DEVICE INCLUDING THE DISPLAY DEVICE

TECHNICAL FIELD

The present invention relates to a driver circuit. The present invention also relates to a display device including the driver circuit, and an electronic device including the display device.

BACKGROUND ART

As large display devices such as liquid crystal televisions become widespread, higher added value is required for display devices and development thereof has been proceeded. In particular, a technique for forming a driver circuit such as a scan line driver circuit over the same substrate as a pixel portion with the use of a thin film transistor (TFT) whose channel region is formed using an amorphous semiconductor (especially, an oxide semiconductor) has actively developed.

A thin film transistor whose channel region is formed using an amorphous semiconductor is often used for a driver circuit formed using only n-channel transistors or p-channel transistors. For example, a structure disclosed in Patent Document 1 is given.

REFERENCE

[Patent Document 1] Japanese Published Patent Application No. 2005-251348

DISCLOSURE OF INVENTION

When a thin film transistor whose channel region is formed using an amorphous semiconductor is used for a driver circuit formed using only n-channel transistors or p-channel transistors, the transistor might become a depletion (also referred to as normally-on) transistor due to change in the threshold voltage, or the like. In the case of using the normally-on transistor, there are problems in that an increase in the power consumption and malfunction such as an abnormal output signal are caused by a leakage current from the transistor.

The degree of change in the threshold voltage varies among substrates in some cases. In circuit design where countermeasures against the case where the transistors become normally-on transistors are taken in advance, there might be a problem in that it is difficult to take countermeasures against the variations. Therefore, it is necessary to employ circuit design of a driver circuit with which an increase in the power consumption and malfunction are not caused regardless of the degree of change in the threshold voltage at which a thin film transistor is normally on.

As an example of a thin film transistor whose threshold voltage can be controlled, an element which includes at least the following four terminals is given: a first gate terminal (referred to as a first gate); a second gate terminal (referred to as a second gate); a drain terminal (also referred to as a drain); and a source terminal (also referred to as a source). A thin film transistor including the four terminals has a channel region between a drain region and a source region, and current can flow between the drain region and the source region through the channel region. In the thin film transistor including the four terminals, the first gate and the second gate are disposed above and below the channel region. A signal (also referred to as a first signal) for controlling switching of conduction and non-conduction of the thin film transistor is supplied to the first gate. A signal (also referred to as a second signal) for controlling the threshold voltage of the thin film transistor is supplied to the second gate.

In the thin film transistor including the four terminals, a terminal connected to a wiring for supplying a high power supply potential Vdd is described as a drain terminal and a terminal connected to a wiring for supplying a low power supply potential Vss is described as a source terminal in some cases. The source terminal is referred to as a first terminal and the drain terminal is referred to as a second terminal in this specification. The signals supplied to the first gate and the second gate may be reversed. That is, the first signal may be supplied to the second gate and the second signal may be supplied to the first gate.

FIG. 8A is a cross-sectional view illustrating an example of a structure of the thin film transistor including the four terminals. As illustrated in FIG. 8A, a thin film transistor 900 is formed as follows: a first gate 901 is provided over a substrate 907; a gate insulating film 902 is provided over the first gate 901; an oxide semiconductor film 903 is provided over the gate insulating film 902; a source terminal 904A and a drain terminal 904B which are formed using a conductive film are provided to cover part of the oxide semiconductor film 903; an insulating layer 905 is provided to cover the oxide semiconductor film 903, the source terminal 904A, and the drain terminal 904B; and a second gate 906 is provided over the insulating layer 905.

FIG. 8B illustrates a circuit symbol of the thin film transistor 900 illustrated in FIG. 8A in which the first gate 901 and the second gate 906 are disposed above and below a channel region. As illustrated in FIG. 8B, the thin film transistor 900 includes the first gate 901, the second gate 906, the source terminal 904A, and the drain terminal 904B. In the thin film transistor 900, a first signal G1 for controlling switching of conduction and non-conduction between the source terminal 904A and the drain terminal 904B is inputted to the first gate 901, and a second signal G2 for controlling the threshold voltage of the thin film transistor is inputted to the second gate 906. Note that the symbol of the thin film transistor 900 illustrated in FIG. 8B represents a thin film transistor which is controlled by four terminals.

The first signal G1 is a signal which performs electric control (switching) between the source terminal 904A and the drain terminal 904B. The second signal G2 is a signal which controls the threshold voltage of the thin film transistor. In an n-channel transistor, the second signal G2 serves as a signal which changes a depletion (normally-on) transistor into an enhancement (normally-off) transistor by application of a negative voltage. Note that the second signal G2 is also referred to as a back-gate voltage Vbg below.

FIG. 9 is a graph illustrating relations between a drain current Id and a gate voltage Vg of the n-channel thin film transistor illustrated in FIGS. 8A and 8B. A curve 911 in FIG. 9 shows the relation in the case of a depletion transistor. Even when the voltage applied to the first gate by the first signal G1 is 0 V, the drain current Id flows. In a circuit formed using a plurality of thin film transistors such as a driver circuit, even when the voltage applied to the first gate is 0 V, that is, even when the driver circuit is not driven, flowing current is accumulated, leading to an increase in the power consumption which cannot be ignored. On the other hand, when a negative voltage is applied to the back gate, the curve 911 is shifted toward the positive side, as shown by a curve 912 in FIG. 9, so that the transistor can be an enhancement transistor. In the enhancement transistor, when the voltage applied to the first gate by the first signal G1 is 0 V, the drain current Id is small; therefore, the power consumption of the driver circuit can be reduced. However, in the case where the curve 911 is shifted toward the positive side, as shown by a curve 913, by making the back-gate voltage Vbg larger in a negative direction, when the thin film transistor is made conductive by the first signal, it is necessary to apply a higher voltage to the first gate. Accordingly, an increase in the power consumption is caused. Moreover, the driver circuit malfunctions in some cases.

FIG. 10 illustrates a bootstrap-type inverter circuit formed using a plurality of n-channel transistors as an example of a circuit included in the driver circuit. The inverter circuit illustrated in FIG. 10 includes a thin film transistor 921, a thin film transistor 922, a thin film transistor 923, a thin film transistor 924, and a capacitor 925. A wiring 926 supplies the high power supply potential Vdd and a wiring 927 supplies the low power supply potential Vss. Second gates of the thin film transistors 921 to 924 are connected to a wiring 928 for supplying the back-gate voltage Vbg. An input signal In serving as the first signal is supplied to first gates of the thin film transistors 921 and 923. An output signal Out is outputted from a node at which the thin film transistor 924 and the thin film transistor 923 are connected to each other.

As described with reference to FIG. 9, in the case where a depletion transistor is included in the inverter circuit illustrated in FIG. 10, the wiring 926 and the wiring 927 are brought into conduction; thus, a large amount of leakage current flows. Even when the back-gate voltage is applied to each of the thin film transistors so that the transistors becomes enhancement transistors and the leakage current is reduced, depending on the voltage of the input signal In, the thin film transistor 921 and the thin film transistor 923 are not turned on and malfunctions are caused. Further, when the voltage of the input signal In is high, the power consumption is increased.

An object of one embodiment of the present invention is, when a thin film transistor whose channel is formed using an amorphous semiconductor is used for a driver circuit formed using only n-channel transistors or p-channel transistors, to provide a driver circuit in which the threshold voltage is compensated in accordance with the degree of change in the threshold voltage at which the transistor becomes a depletion transistor; thus, an increase in the power consumption and malfunctions can be suppressed.

One embodiment of the present invention is a driver circuit which includes a unipolar transistor including a first gate and a second gate disposed above and below a semiconductor layer with insulating layers provided therebetween. In the driver circuit, a first signal for controlling switching of the transistor is inputted to the first gate and a second signal for controlling a threshold voltage of the transistor is inputted to the second gate. The second signal is controlled in accordance with a value of current consumption including a current which flows between a source and a drain of the transistor.

According to one embodiment of the present invention, a driver circuit described as follows can be provided: the threshold voltage is compensated in accordance with the degree of change in the threshold voltage so that an increase in the power consumption and malfunctions can be suppressed when a thin film transistor that can become a depletion transistor is used for a driver circuit formed using only n-channel transistors or p-channel transistors.

Note that a "unipolar circuit" in this specification refers to a circuit including transistor elements which have the same conductivity type. Specifically, the "unipolar circuit" in this specification refers to a circuit including n-channel transistors or a circuit including p-channel transistors.

BRIEF DESCRIPTION OF DRAWINGS

In the accompanying drawings:

FIG. 2 is a flow chart of setting operations based on change in a current value (a voltage value) of a back-gate voltage;

BEST MODE FOR CARRYING OUT THE INVENTION

Figure 1:
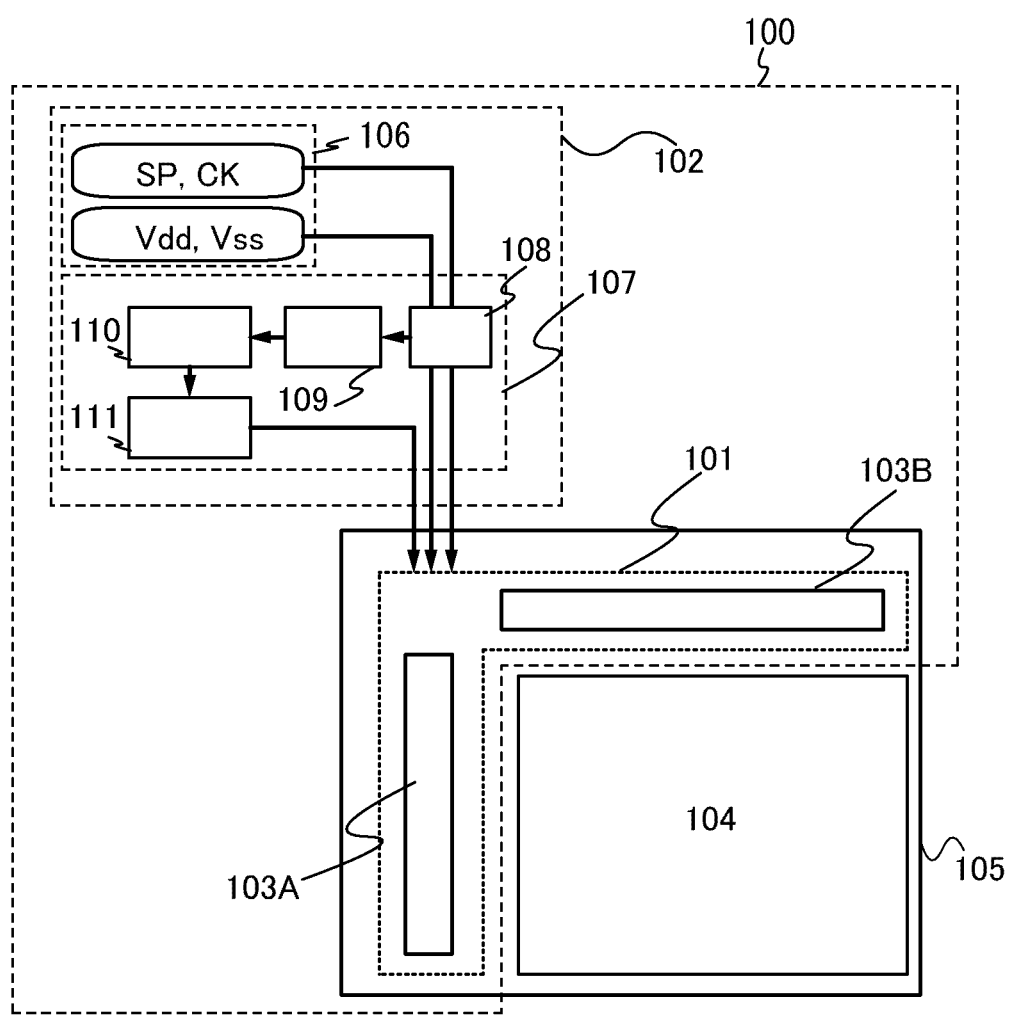
FIG. 1 is a block diagram illustrating an example of a display device.

Hereinafter, embodiments and an example of the present invention will be described with reference to the drawings. Note that the present invention can be implemented in various different ways and it will be readily appreciated by those skilled in the art that modes and details of the present invention can be changed in various ways without departing from the spirit and scope of the present invention. Therefore, the present invention should not be construed as being limited to the following description of the embodiments and the example. Note that in structures of the present invention described below, reference numerals denoting the same portions are used in common in different drawings.

Note that the size, the thickness of a layer, or a region in each structure illustrated in drawings and the like in embodiments is exaggerated for simplicity in some cases. Therefore, embodiments of the present invention are not limited to such scales.

Note that in this specification, terms such as "first", "second", "third", and "N-th" (N is a natural number) are used in order to avoid confusion among components and do not limit the number of the components.

Embodiment 1

In this embodiment, a block diagram of circuits near a driver circuit will be described. FIG. 1 illustrates an example of a driver circuit of a display device.

A driver circuit 100 in this embodiment includes a display portion driver circuit 101 and a control circuit 102.

The display portion driver circuit 101 includes a gate line driver circuit 103A and a signal line driver circuit 103B, for example. The gate line driver circuit 103A and the signal line driver circuit 103B are each a driver circuit which drives a display portion 104 including a plurality of pixels. The gate line driver circuit 103A, the signal line driver circuit 103B, and the display portion 104 are formed using thin film transistors which are formed over a substrate 105.

Note that the thin film transistors included in the gate line driver circuit 103A, the signal line driver circuit 103B, and the display portion 104 are unipolar transistors, specifically, n-channel thin film transistors. As an n-channel thin film transistor, it is preferable to use a thin film transistor in which an oxide semiconductor is used for a semiconductor layer. An oxide semiconductor is used for a semiconductor layer of a thin film transistor, so that the field effect mobility can be increased as compared with a silicon-based semiconductor material such as amorphous silicon. Note that zinc oxide (ZnO) or tin oxide ($SnO_2$) can be used as the oxide semiconductor, for example. Further, In, Ga, or the like can be added to ZnO.

As the oxide semiconductor, a thin film represented by $InMO_3 (ZnO)_x(x>0)$ can be used. Note that M represents one or more metal elements selected from gallium (Ga), iron (Fe), nickel (Ni), manganese (Mn), and cobalt (Co). As an example, M might be Ga or might include the above metal element in addition to Ga, for example, M might be Ga and Ni or Ga and Fe. Further, in the oxide semiconductor, in some cases, a transitional metal element such as Fe or Ni or an oxide of the transitional metal is contained as an impurity element in addition to the metal element contained as M. For example, an In—Ga—Zn—O-based film can be used for an oxide semiconductor layer.

As the oxide semiconductor film ($InMO_3 (ZnO)_x(x>0)$ film), an $InMO_3(ZnO)_x$ ($x>0$) film in which M is a different metal element may be used instead of the In—Ga—Zn—O-based film. As the oxide semiconductor, any of the following oxide semiconductors can be used in addition to the above: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

The gate line driver circuit 103A and the signal line driver circuit 103B include unipolar transistors. The unipolar transistor includes the first gate and the second gate. The first gate is disposed below a semiconductor layer with an insulating layer provided therebetween, and the second gate is disposed above the semiconductor layer with an insulating layer provided therebetween, as described in FIG. 8A. Note that the positions of the first gate and the second gate may be reversed.

Figure 8A:
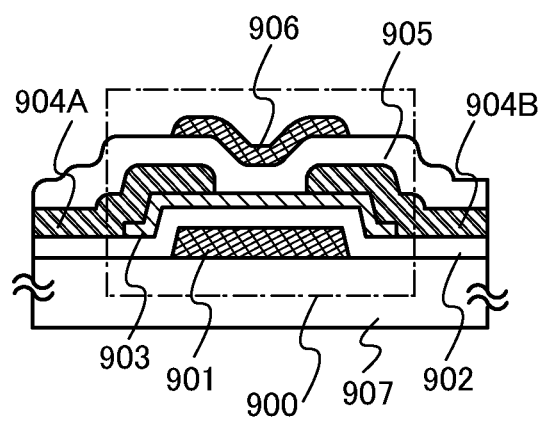
FIG. 8A is a cross-sectional view illustrating an example of a thin film transistor and FIG. 8B is an example of a circuit symbol thereof.
Figure 8B:
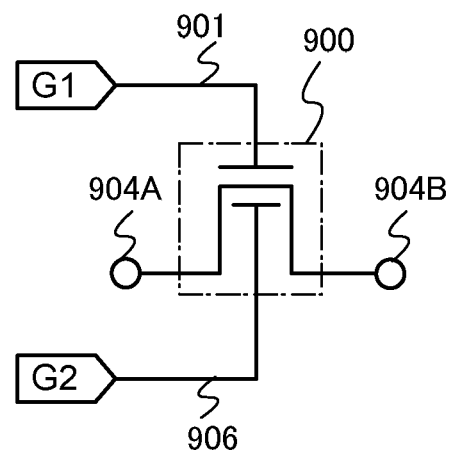
Figure 9:
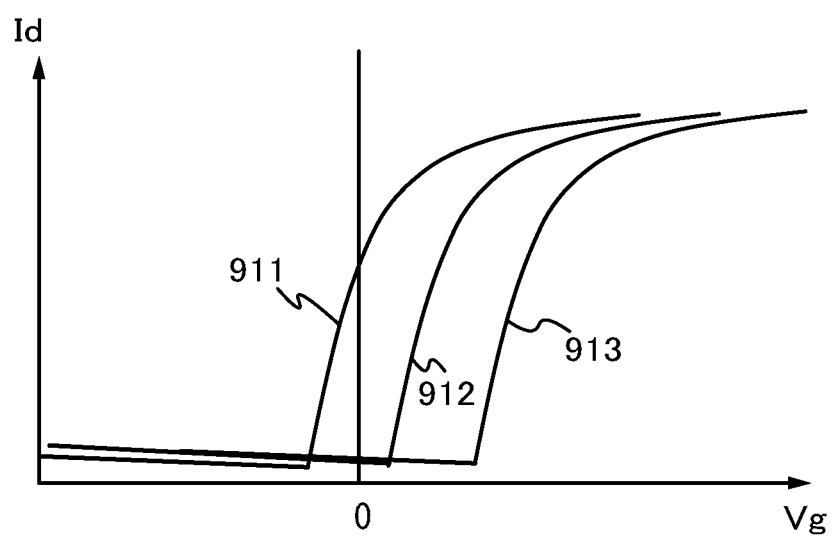
FIG. 9 is a graph illustrating relations between Id-Vg characteristics and a back-gate voltage Vbg of a thin film transistor.
Figure 10:
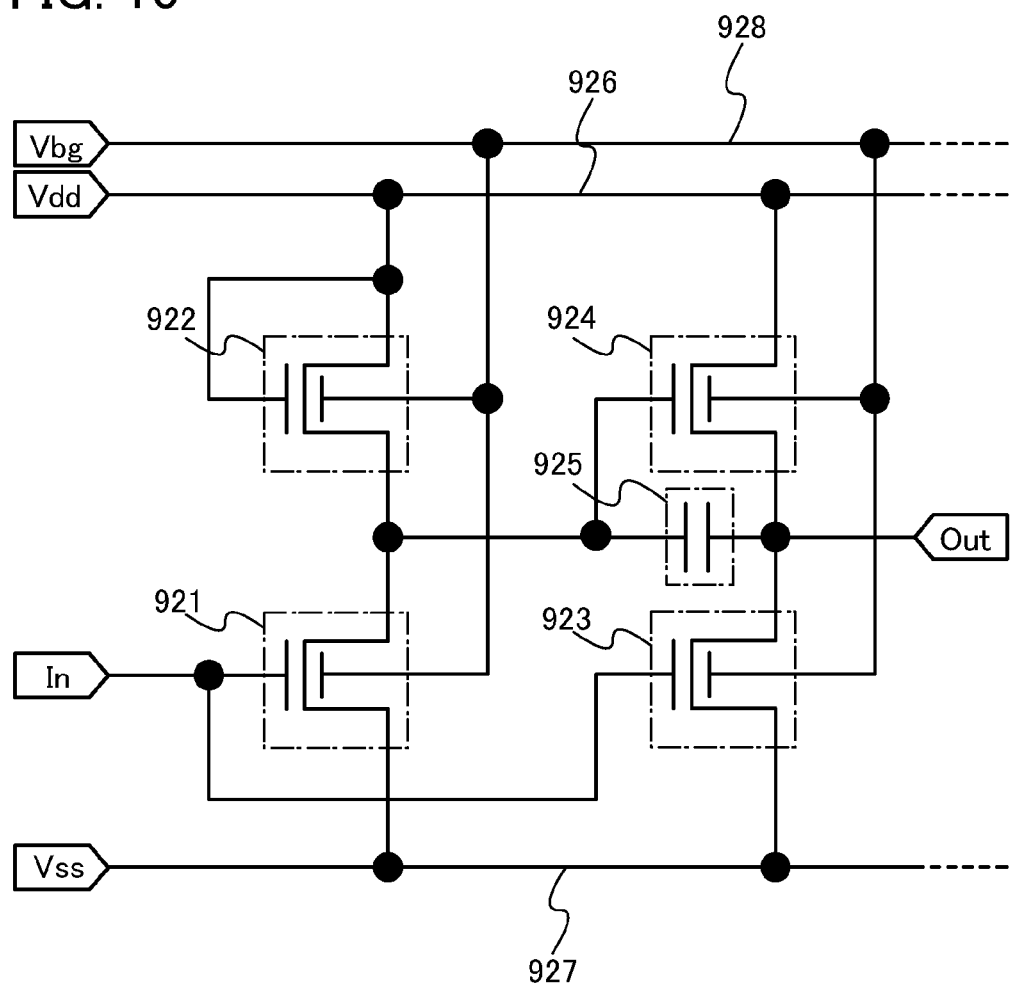
FIG. 10 is a circuit diagram illustrating a bootstrap type inverter circuit in which unipolar (n-channel) transistors are used.

A transistor included in a driver circuit described in this specification is an element including at least four terminals of the first gate, the second gate, the drain, and the source as shown in FIG. 8A, and current can flow between the drain and the source through the channel region. A first signal inputted to the first gate is a signal for controlling switching of the transistor. A second signal inputted to the second gate is a signal for controlling the threshold voltage of the transistor. Note that the second signal is referred to as a back-gate voltage Vbg in some cases.

The control circuit 102 supplies a signal for controlling the display portion driver circuit 101. The display portion driver circuit 101 is driven so as to perform display in the display portion 104. The control circuit 102 includes a signal generation circuit 106 and a back-gate voltage control circuit 107. The signal generation circuit 106 outputs signals for performing panel display in the display portion 104 through the display portion driver circuit 101. The back-gate voltage control circuit 107 controls the threshold voltage of unipolar transistors included in the display portion driver circuit.

The signal generation circuit 106 outputs pulse signals for performing panel display in the display portion 104 to the display portion driver circuit 101 via wirings. The pulse signals pass through the gate line driver circuit 103A and the signal line driver circuit 103B and outputted to the display portion 104. Specifically, the signal generation circuit 106 operates as follows: the high power supply potential Vdd and the low power supply potential Vss, which are power supply voltages, are supplied to the gate line driver circuit 103A and the signal line driver circuit 103B: a start pulse SP and a clock signal CK for a gate line driver circuit are generated and outputted to the gate line driver circuit 103A and/or a start pulse SP and a clock signal CK for a signal line driver circuit are generated and outputted to the signal line driver circuit 103B. Note that the signal generation circuit 106 may generate another signal such as an image signal or a latch signal.

The back-gate voltage control circuit 107 includes a current value detection circuit 108, a judgment circuit 109, a correction voltage memory circuit 110, and a correction voltage output circuit 111.

In the current value detection circuit 108, the current value is measured and outputted to the judgment circuit 109 every given period. The measurement in the current value detection circuit 108 is not limited to the current value, and voltage values of both terminals of constant-value resistors which are connected in series in the current value detection circuit 108 may be detected. The structure in which a wiring for supplying power supply potentials (Vdd, Vss) and a wiring for supplying a clock signal and a start pulse are connected to the current value detection circuit 108 is illustrated; however, the structure of the current value detection circuit 108 is not limited thereto. For example, only the wiring for supplying a power supply potential may be provided with the current value detection circuit 108. The power supply potential is a signal of a direct current, and thus, an increase in the current value due to a leakage current is easily detected, which is preferable.

The timing when back-gate voltage setting treatment starts, that is, a period of time (also referred to as a current value measurement period) when the current value or the voltage value is measured in the current value detection circuit 108, may be after the power of the driver circuit 100 is supplied, or may be every given period while the driver circuit 100 operates.

The judgment circuit 109 judges weather the strength X of the current value or the voltage value measured in the current value detection circuit 108 is smaller than the strength A of the reference value set in advance. In the case where the strength X is larger than the strength A, at the value of the back-gate voltage Vbg in the current value measurement period, the current which flows between the source and the drain of the transistor included in the driver circuit is large, the Id-Vg characteristics of a plurality of unipolar transistors included in the driver circuit are normally-on, the current consumption including the current which flows between the source and the drain of the transistor included in the display portion driver circuit 101 is large.

Note that although the strength X is expressed using the current value or the voltage value in this embodiment, the strength X expressed using another physical value may be compared with the strength A of the reference value.

A decrease in current consumption can occur in the case where the switching of the transistor is not performed. For example, when the back-gate voltage is made extremely low and applied to the second gate, the current consumption is decreased and the desired pulse wave pattern cannot be obtained. Thus, when the back-gate voltage is set, a sufficiently high voltage, for example, a voltage at which a transistor becomes surely a depletion transistor, is preferably applied as the initial value of the back-gate voltage when the back-gate voltage setting treatment starts. As described above, the initial value of the back-gate voltage in the n-channel transistor is set at a sufficiently high, so that the back-gate voltage can be set at which the operation of the transistor can be more stable even when the normal operation is difficult because the transistor has been an enhancement transistor whose threshold voltage is extremely shifted toward the high potential side.

The correction voltage memory circuit 110 is a circuit for setting the back-gate voltage Vbg. The correction voltage memory circuit 110 sets and stores the level of a voltage outputted as the back-gate voltage Vbg from the correction voltage output circuit 111 on the basis of the judgment result of the judgment circuit 109. Specifically, in the case where the result of the judgment circuit 109 is that the strength X≥the strength A, the value in which Vstep which is set in advance is added to the value of Vbg, that is, the value of Vbg−Vstep, is stored as a new value of Vbg. On the other hand, in the case where the result of the judgment circuit 109 is that the strength X<the strength A, the value of Vbg in this setting treatment is stored and the operation of setting treatment of Vbg is finished.

Then, the value of the back-gate voltage Vbg stored in the correction voltage memory circuit 110 is outputted from the correction voltage output circuit 111 as the back-gate voltage Vbg. In other words, in the period of time expect the back-gate voltage setting treatment period, a constant back-gate voltage Vbg is continuously outputted from the correction voltage output circuit 111 on the basis of the value of the back-gate voltage Vbg stored in the correction voltage memory circuit 110.

The correction voltage memory circuit 110 preferably includes a nonvolatile memory device. When the power supply is not supplied, the back-gate voltage Vbg stored in the correction voltage memory circuit 110 is stored in the nonvolatile memory device; thus, the back-gate voltage Vbg with the same value as that before the power supply is not supplied can be outputted from the collection voltage output circuit 111. Accordingly, when the power supply of the driver circuit 100 is turned on, the back-gate voltage Vbg can be outputted immediately, without the back-gate voltage setting treatment.

It is preferable that the signal generation circuit 106 and the back-gate voltage control circuit 107 be formed using transistors formed over a substrate which is not the substrate over which the gate line driver circuit 103A, the signal line driver circuit 103B, and the display portion 104 are formed. As an example, transistors formed using a single-crystal semiconductor are preferably used for the signal generation circuit 106 and the back-gate voltage control circuit 107. The shift of the threshold voltage of a transistor formed using a single-crystal semiconductor is small; thus, malfunctions hardly occur and a stable signal can be outputted.

Note that the high power supply potential refers to a signal having a potential which is higher than a reference potential, and the low power supply potential refers to a signal having a potential which is lower than or equal to the reference potential. It is preferable that the high power supply potential and the low power supply potential be each a potential at which a transistor can operate and deterioration, breakdown, or power consumption does not matter. The reference potential refers to a ground potential GND, or the like.

Note that voltage refers to a potential difference between a given potential and a reference potential (e.g., a ground potential) in many cases. Accordingly, voltage, a potential, and a potential difference can be referred to as a potential, voltage, and a voltage difference, respectively.

The operation of the back-gate voltage control circuit 107 in the driver circuit illustrated in FIG. 1 will be described with reference to a flow chart illustrated in FIG. 2. Further, the driver circuit in this embodiment with less power consumption and less malfunctions will be described even in the case where the transistors included in the driver circuit have variations in normally-on state.

First, the power supply voltage is applied to the display portion driver circuit and the back-gate voltage Vbg is applied to the second gate (FIG. 2, a step 201). The initial value of the back-gate voltage Vbg applied to the second gate may be set in the correction voltage memory circuit 110 illustrated in FIG. 1 in advance. Alternatively, the back-gate voltage Vbg which is stored in the correction voltage memory circuit 110 when the power supply is not supplied may be outputted as it is. The back-gate voltage Vbg is applied from the correction voltage output circuit 111 illustrated in FIG. 1 to the second gate of the transistor included in the driver circuit.

Next, in the current value detection circuit 108 in the back-gate voltage control circuit 107 illustrated in FIG. 1, the level of the current flowing through a wiring supplied from the signal generation circuit 106 or the level of voltages of both terminals of constant-value resistors which are connected in series is measured (FIG. 2, a step 202). As described above, when the transistor is a depletion transistor, the current value (or the voltage value) which is detected in the current value detection circuit is large as compared with an enhancement transistor.

Then, in the judgment circuit 109 illustrated in FIG. 1, it is judged that weather the strength X of the current value or the voltage value is smaller than the strength A of the reference value or not (FIG. 2, a step 203). At this time, in the case where the transistor becomes an enhancement transistor by the application of the back-gate voltage Vbg in the step 201 and the strength X of the current value or the voltage value is smaller than the strength A of the reference value, it is judged that the current consumption including the leakage current which flows through the transistor is small; therefore, the value of the back-gate voltage Vbg in this setting treatment is stored in the correction voltage memory circuit 110.

On the other hand, in the judgment circuit 109, in the case where the strength X of the current value or the voltage value is larger than or equal to the strength A of the reference value, it is judged that the current consumption including the leakage current which flows through the transistor included in the display portion driver circuit 101 is large. In that case, the value in which Vstep which is set in advance is added to the back-gate voltage, that is, the value of Vbg−Vstep is set as a new value of Vbg and applied to the second gate (FIG. 2, a step 204).

The level of Vstep for setting the back-gate voltage Vbg is set in accordance with the number of successive operations for setting the back-gate voltage Vbg.

Next, in a manner similar to that in the step 202, in the current value detection circuit 108 in the back-gate voltage control circuit 107 illustrated in FIG. 1, the level of the current or the level of the voltage supplied via a wiring from the signal generation circuit 106 is measured (FIG. 2, a step 205).

Then, in a manner similar to that in the step 203, in the judgment circuit 109 illustrated in FIG. 1, judgment weather the current value or the voltage value is smaller than the reference value or not is performed (FIG. 2, a step 206). At this time, in the case where the transistor becomes an enhancement transistor by the application of the back-gate voltage Vbg in the step 204 and the strength X of the current value or the voltage value is smaller than the strength A of the reference value, it is judged that the current consumption including the leakage current which flows through the transistor is small; therefore, the value of the back-gate voltage Vbg in this setting treatment is stored in the correction voltage memory circuit 110.

In order to realize more stable normal operation of the driver circuit, it is preferable that an extra voltage (a margin) set in advance be further added to the value of the back-gate voltage Vbg which is judged to be decreased in the current consumption and the value added with the extra voltage be stored in the correction voltage memory circuit 110. In such a manner, in the case where the back-gate voltage Vbg has the margin, even when the TFT characteristics are changed in some degree because of long interval of the back-gate voltage setting treatment, the normal operation can be realized with more certainty.

In the judgment circuit 109 again, in the case where the strength X of the current value or the voltage value is larger than or equal to the strength A of the reference value, it is judged that the current consumption including the leakage current which flows through the transistor included in the display portion driver circuit 101 is large. In that case, the step is returned to the step 204 shown in FIG. 2 and is followed by the next step.

According to the above operations, when a thin film transistor that can become a depletion transistor is used for a driver circuit formed using only n-channel transistors or p-channel transistors in the display portion driver circuit, the threshold voltage is compensated in accordance with the degree of change in the threshold voltage, so that an increase in the power consumption or malfunctions can be suppressed.

Figure 3A:
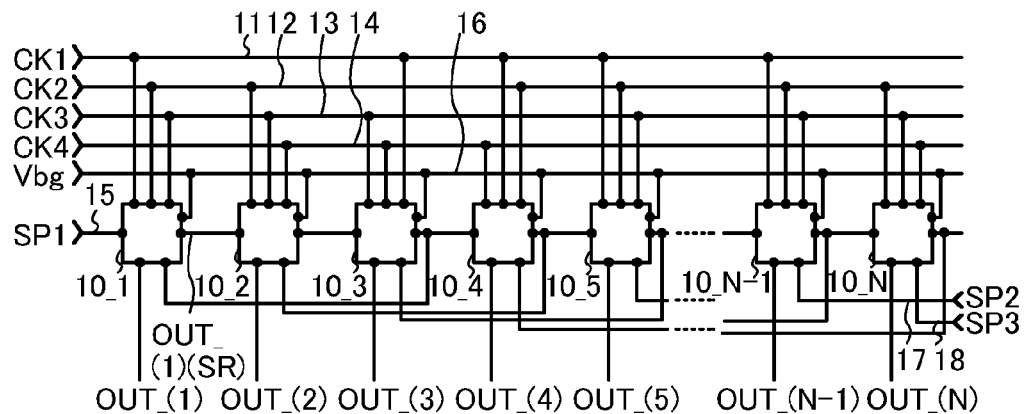
FIGS. 3A to 3C are diagrams illustrating an example of a circuit included in a shift register circuit.
Figure 3B:
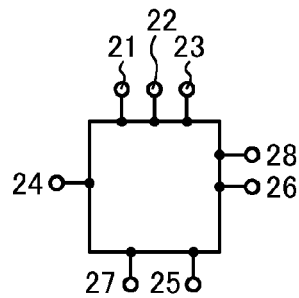
Figure 3C:
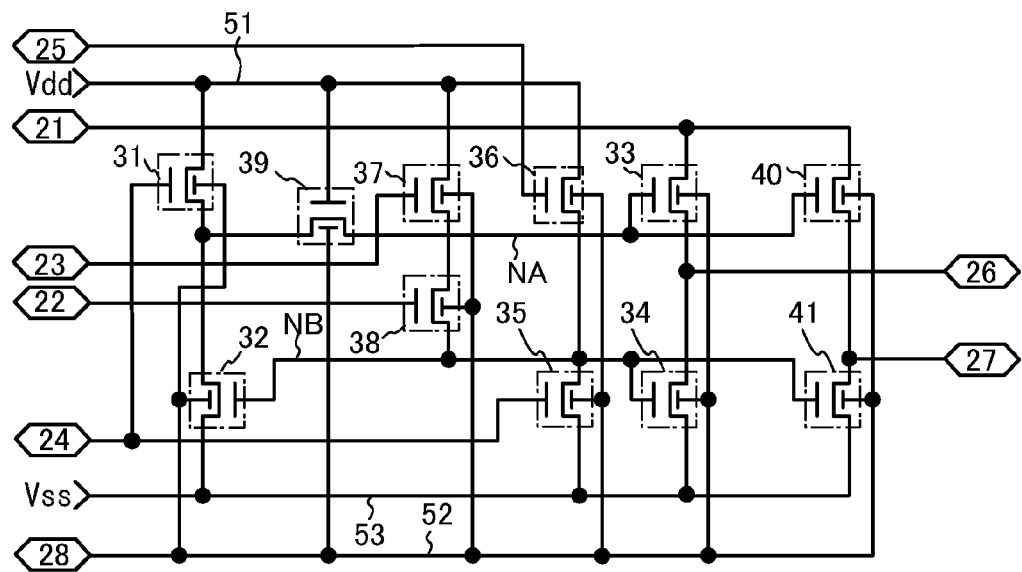

Next, FIGS. 3A to 3C illustrate an example of a structure of a shift register included in the display portion driver circuit.

A shift register illustrated in FIG. 3A includes first to N-th pulse output circuits 10_1 to 10_N (N is a natural number greater than or equal to 3). In the first to N-th pulse output circuits 10_1 to 10_N in the shift register illustrated in FIG. 3A, a first clock signal CK1, a second clock signal CK2, a third clock signal CK3, and a fourth clock signal CK4 are supplied from a first wiring 11, a second wiring 12, a third wiring 13, and a fourth wiring 14, respectively. A start pulse SP1 (a first start pulse) is inputted from a fifth wiring 15 to the first pulse output circuit 10_1. To an n-th pulse output circuit 10_n of the second or subsequent stage (n is a natural number greater than or equal to 2 and less than or equal to N), a signal from a pulse output circuit of the preceding stage (such a signal is referred to as a preceding-stage signal OUT(n−1)) is inputted. To the first pulse output circuit 10_1, a signal from the third pulse output circuit 10_3 of a stage following the next stage is inputted. Similarly, to the n-th pulse output circuit 10_n of the second or subsequent stage, a signal from the (n+2)th pulse output circuit 10_(n+2) of the stage following the next stage (such a signal is referred to as a subsequent-stage signal OUT(n+2)) is inputted. Therefore, from the pulse output circuits of the respective stages, first output signals OUT(1)(SR) to OUT(N)(SR) to be inputted to the pulse output circuits of the subsequent stages and/or the stages before the preceding stages and second output signals OUT(1) to OUT(N) to be electrically connected to different wirings or the like are outputted. Further, the back-gate voltage Vbg is supplied from the back-gate voltage control circuit 107 via a sixth wiring 16 to the pulse output circuits of the respective stages. Note that since the subsequent-stage signal OUT(n+2) is not inputted to the last two stages of the shift register as illustrated in FIG. 3A, a second start pulse SP2 and a third start pulse SP3 may be inputted from a seventh wiring 17 and an eighth wiring 18, respectively, to the corresponding last two stages, for example. Alternatively, signals may be generated inside. For example, a (n+1)th pulse output circuit 10_(n+1) and a (n+2)th pulse output circuit 10_(n+2) which do not contribute to output of pulses to a display portion (such circuits are also referred to as dummy stages) may be provided, and signals corresponding to a second start pulse (SP2) and a third start pulse (SP3) may be generated from the dummy stages.

Note that each of the first to fourth clock signals (CK1) to (CK4) is a signal that oscillates between an H-level signal and an L-level signal at regular intervals. Further, the first to fourth clock signals (CK1) to (CK4) are delayed by ¼ cycle sequentially. In this embodiment, driving of the pulse output circuits is controlled with the first to fourth clock signals (CK1) to (CK4). Note that the clock signal is also referred to as GCK or SCK in some cases depending on a driver circuit to which the clock signal is inputted, and the clock signal is referred to as CK in the following description.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

Each of the first to N-th pulse output circuits 10_1 to 10_N includes a first input terminal 21, a second input terminal 22, a third input terminal 23, a fourth input terminal 24, a fifth input terminal 25, a first output terminal 26, a second output terminal 27, and a sixth input terminal 28 (see FIG. 3B).

The first input terminal 21, the second input terminal 22, and the third input terminal 23 are electrically connected to any of the first to fourth wirings 11 to 14. For example, in the first pulse output circuit 10_1 in FIGS. 3A and 3B, the first input terminal 21 is electrically connected to the first wiring 11; the second input terminal 22 is electrically connected to the second wiring 12; and the third input terminal 23 is electrically connected to the third wiring 13. In the second pulse output circuit 102, the first input terminal 21 is electrically connected to the second wiring 12; the second input terminal 22 is electrically connected to the third wiring 13; and the third input terminal 23 is electrically connected to the fourth wiring 14.

In the first pulse output circuit 10_1 in FIGS. 3A and 3B, a start pulse is inputted to the fourth input terminal 24; a subsequent-stage signal OUT(3) is inputted to the fifth input terminal 25; the first output signal OUT(1)(SR) is outputted from the first output terminal 26; the second output signal OUT(1) is outputted from the second output terminal 27; and the back-gate voltage Vbg is inputted from the sixth input terminal 28.

Next, an example of a specific circuit structure of the pulse output circuit is described with reference to FIG. 3C.

In FIG. 3C, a first terminal of a first transistor 31 is electrically connected to a wiring 51. A second terminal of the first transistor 31 is electrically connected to a first terminal of a ninth transistor 39. A gate electrode of the first transistor 31 is electrically connected to a fourth input terminal 24. A first terminal of a second transistor 32 is electrically connected to a power supply line 53. A second terminal of the second transistor 32 is electrically connected to the first terminal of the ninth transistor 39. A gate electrode of the second transistor 32 is electrically connected to a gate electrode of a fourth transistor 34. A first terminal of a third transistor 33 is electrically connected to a first input terminal 21. A second terminal of the third transistor 33 is electrically connected to a first output terminal 26. A first terminal of the fourth transistor 34 is electrically connected to the power supply line 53. A second terminal of the fourth transistor 34 is electrically connected to the first output terminal 26. A first terminal of a fifth transistor 35 is electrically connected to the power supply line 53. A second terminal of the fifth transistor 35 is electrically connected to the gate electrode of the second transistor 32 and the gate electrode of the fourth transistor 34. A gate electrode of the fifth transistor 35 is electrically connected to the fourth input terminal 24. A first terminal of a sixth transistor 36 is electrically connected to the wiring 51. A second terminal of the sixth transistor 36 is electrically connected to the gate electrode of the second transistor 32 and the gate electrode of the fourth transistor 34, and gate electrode of the sixth transistor 36 is electrically connected to the fifth input terminal 25. A first terminal of a seventh transistor 37 is electrically connected to the wiring 51. A second terminal of the seventh transistor 37 is electrically connected to a second terminal of an eighth transistor 38. A gate electrode of the seventh transistor 37 is electrically connected to the third input terminal 23. A first terminal of the eighth transistor 38 is electrically connected to the gate electrode of the second transistor 32 and the gate electrode of the fourth transistor 34. A gate electrode of the eighth transistor 38 is electrically connected to the second input terminal 22. The first terminal of the ninth transistor 39 is electrically connected to the second terminal of the first transistor 31 and the second terminal of the second transistor 32. A second terminal of the ninth transistor 39 is electrically connected to a gate electrode of the third transistor 33 and a gate electrode of a tenth transistor 40. A gate electrode of the ninth transistor 39 is electrically connected to the wiring 51. A first terminal of the tenth transistor 40 is electrically connected to the first input terminal 21. A second terminal of the tenth transistor 40 is electrically connected to the second output terminal 27. The gate electrode of the tenth transistor 40 is electrically connected to the second terminal of the ninth transistor 39. A first terminal of an eleventh transistor 41 is electrically connected to the power supply line 53. A second terminal of the eleventh transistor 41 is electrically connected to the second output terminal 27. A gate electrode of the eleventh transistor 41 is electrically connected to the gate electrode of the second transistor 32 and the gate electrode of the fourth transistor 34. Second gates of the first to eleventh transistors 31 to 41 are electrically connected to a wiring 52 for supplying the back-gate voltage Vbg.

In FIG. 3C, a connection point of the gate electrode of the third transistor 33, the gate electrode of the tenth transistor 40, and the second terminal of the ninth transistor 39 is referred to as a node NA. Further, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node NB.

In the case where the pulse output circuit in FIG. 3C is the first pulse output circuit 10_1, the first clock signal CK1 is inputted to the first input terminal 21; the second clock signal CK2 is inputted to the second input terminal 22; the third clock signal CK3 is inputted to the third input terminal 23; the start pulse SP is inputted to the fourth input terminal 24; the subsequent-stage signal OUT(3) is inputted to the fifth input terminal 25; the first output signal OUT(1)(SR) is outputted from the first output terminal 26; the second output signal OUT(1) is outputted from the second output terminal 27; and a judgment signal JS is inputted to the sixth input terminal 28.

Figure 4:
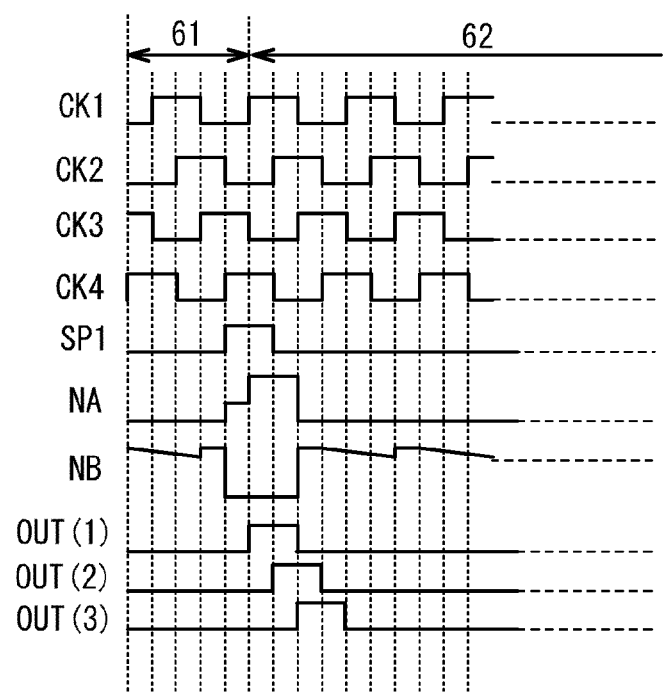
FIG. 4 is an example of a timing chart of a shift register.

FIG. 4 illustrates a timing chart of a shift register including a plurality of pulse output circuits illustrated in FIG. 3C. Note that when the shift register is included in a scan line driver circuit, a period 61 in FIG. 4 corresponds to a vertical retrace period and a period 62 in FIG. 4 corresponds to a gate selection period.

When the transistor included in the driver circuit is a depletion transistor, the wiring 51 and the wiring 53 are brought into conduction, leading to a leakage current. In the driver circuit manufactured using a plurality of n-channel transistors illustrated in FIGS. 3A to 3C and FIG. 4 as an example, the power consumption due to such a leakage current can be reduced by application of the back-gate voltage Vbg. Further, by the application of the back-gate voltage Vbg, the thin film transistor can be an enhancement transistor which does not interrupt the operation of the driver circuit, without being an enhancement transistor whose threshold voltage is extremely shifted toward the high potential side. Therefore, when a thin film transistor that can become a depletion transistor is used for a driver circuit formed using only n-channel transistors or p-channel transistors in the display portion driver circuit, the threshold voltage is compensated in accordance with the degree of change in the threshold voltage, so that an increase in the power consumption or malfunctions can be suppressed.

This embodiment can be combined with any of the structures described in the other embodiments as appropriate.

Embodiment 2

In this embodiment, the driver circuit described in the above embodiment and a cross-sectional view of a display device including a display portion controlled by the driver circuit will be described with reference to FIG. 5. Further, in this embodiment, an example of a liquid crystal display device will be described as the display device; however, the present invention can be used for another display device including a light-emitting element such as an organic EL element or a driver circuit for an electronic paper including an electrophoretic element. Note that the structure described in the above embodiment can be applied to a different device such as a driver circuit for an optical sensor, in addition to the driver circuit of the display device.

Figure 5:
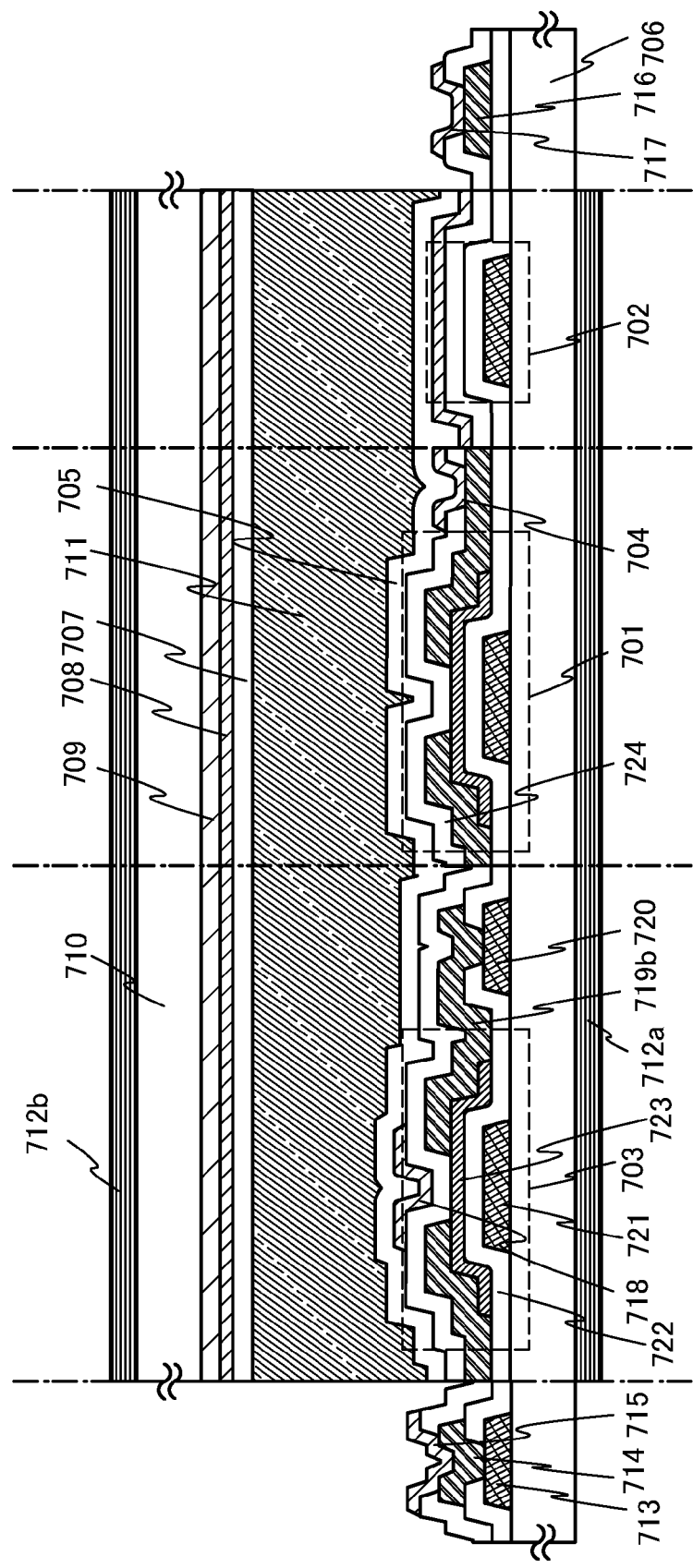
FIG. 5 is a cross-sectional view illustrating an example of a display device.

A liquid crystal display device which is one embodiment of the present invention is illustrated in FIG. 5. In the liquid crystal display device in FIG. 5, a substrate 706 which is provided with a pixel portion including a thin film transistor 701 and a capacitor 702, a driver circuit portion including a thin film transistor 703, a pixel electrode layer 704, and an insulating layer 705 serving as an alignment film, and a counter substrate 710 which is provided with an insulating layer 707 serving as an alignment film, a counter electrode layer 708, and a coloring layer 709 serving as a color filter face each other with a liquid crystal layer 711 positioned between the substrates. The substrate 706 is provided with a polarizing plate (a layer including a polarizer, also simply referred to as a polarizer) 712a on a side opposite to the liquid crystal layer 711, and the counter substrate 710 is provided with a polarizing plate 712b on a side opposite to the liquid crystal layer 711. A first terminal 713, a connection electrode 714, and a terminal electrode 715 for connection are provided in a terminal portion for a gate wiring, and a second terminal 716 and a terminal electrode 717 for connection are provided in a terminal portion for a source wiring.

In the thin film transistor 703 in the driver circuit portion, a semiconductor layer 723 is provided over a gate electrode layer 721 and a gate insulating layer 722, an oxide insulating layer 724 is provided over the semiconductor layer 723, and a conductive layer 718 is provided over the oxide semiconductor layer 724. A drain electrode layer 719*b* is electrically connected to a conductive layer 720 which is formed in the same step as the gate electrode layer 721. In the pixel portion, a drain electrode layer of the thin film transistor 701 is electrically connected to the pixel electrode layer 704.

The use of an oxide semiconductor for a thin film transistor leads to reduction in manufacturing cost. The thin film transistor formed using an oxide semiconductor has high field-effect mobility and is favorably used in a pixel portion and a driver circuit of a display device. On the other hand, an oxide semiconductor tends to have n-type conductivity due to a defect of void by lack of oxygen even when an extrinsic impurity is not added. When an oxide insulating film is formed in contact with an oxide semiconductor layer, a thin film transistor with stable electrical characteristics can be obtained. Even if an oxide semiconductor is made to have n-type conductivity so that a normally-on thin film transistor is formed, in the driver circuit of this embodiment, the threshold voltage is compensated in accordance with the degree of change in the threshold voltage; thus, an increase in the power consumption and malfunctions can be suppressed.

Note that although an example of a thin film transistor whose semiconductor layer is formed using an oxide semiconductor in the thin film transistor of Embodiment 1 is described in this embodiment, in the structure described in Embodiment 1, the thin film transistor that can become the depletion transistor included in the driver circuit has the first gate and the second gate. Therefore, for example, the structure described in Embodiment 1 can be used for a normally-on thin film transistor when a semiconductor layer of the thin film transistor formed using amorphous silicon intentionally or unintentionally contains an impurity imparting n-type conductivity.

With the use of the driver circuit whose structure is the same or substantially the same as that in Embodiment 1, when a thin film transistor that can become a depletion transistor is used for a driver circuit formed using only n-channel transistors or p-channel transistors in the display portion driver circuit, the threshold voltage is compensated in accordance with the degree of change in the threshold voltage, so that an increase in the power consumption or malfunctions can be suppressed.

This embodiment can be combined with any of the structures described in the other embodiments as appropriate.

Embodiment 3

In this embodiment, an example in which at least some of driver circuits and a thin film transistor provided in a pixel portion are formed over the same substrate will be described below. Note that the thin film transistor formed over the substrate may be formed as illustrated in the cross-sectional view in Embodiment 2.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_*k* (k is a natural number). An example where the thin film transistors 5603_1 to 5603_*k* are n-channel TFTs is described below.

A connection relation in the signal line driver circuit is described using the switching circuit 5602_1 as an example. First terminals of the thin film transistors 5603_1 to 5603_*k* are connected to wirings 5604_1 to 5604_*k*, respectively. Second terminals of the thin film transistors 5603_1 to 5603_*k* are connected to signal lines S1 to Sk, respectively. Gates of the thin film transistors 5603_1 to 5603_*k* are connected to a wiring 5605_1.

The shift register 5601 has a function of sequentially selecting the switching circuits 5602_1 to 5602_N by sequentially outputting H-level signals (also referred to as H signals or signals at high power supply potential levels) to the wiring 5605_1 and wirings 5605_2 to 5605_N.

The switching circuit 5602_1 has a function of controlling a conduction state between the wirings 5604_1 to 5604_*k* and the signal lines S1 to Sk (electrical continuity between the first terminal and the second terminal), that is, a function of controlling whether potentials of the wiring 5604_1 to 5604_*k* are supplied to the signal lines S1 to Sk. In this manner, the switching circuit 5602_1 functions as a selector. In a similar manner, the thin film transistors 5603_1 to 5603_*k* have functions of controlling conduction states between the wirings 5604_1 to 5604_*k* and the signal lines S1 to Sk, respectively, that is, functions of supplying potentials of the wirings 5604_1 to 5604_*k* to the signal lines S1 to Sk, respectively. In this manner, each of the thin film transistors 5603_1 to 5603_*k* functions as a switch.

The video signal data (DATA) is inputted to each of the wirings 5604_1 to 5604_*k*. The video signal data (DATA) is an analog signal corresponding to image data or an image signal, in many cases.

Figure 6A:
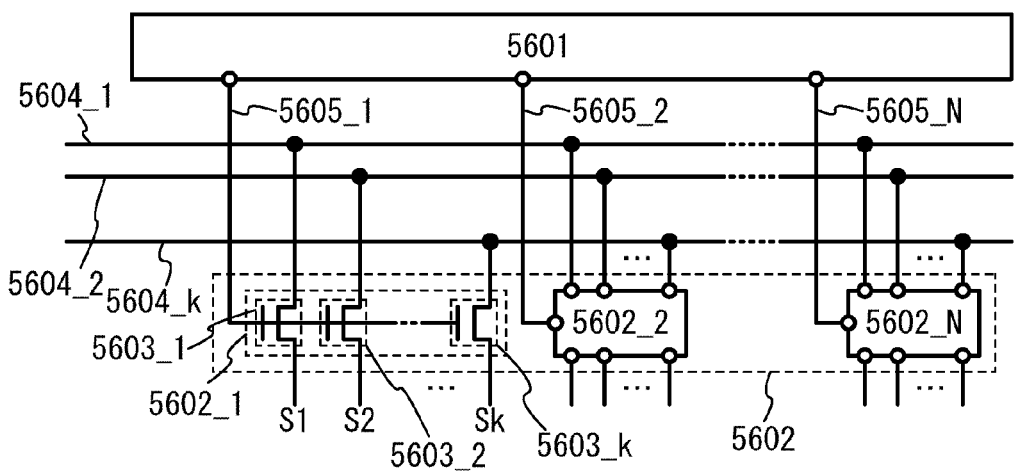
FIG. 6A is a block diagram illustrating an example of a signal line driver (a source driver) circuit and FIG. 6B is an example of a timing chart thereof.
Figure 6B:
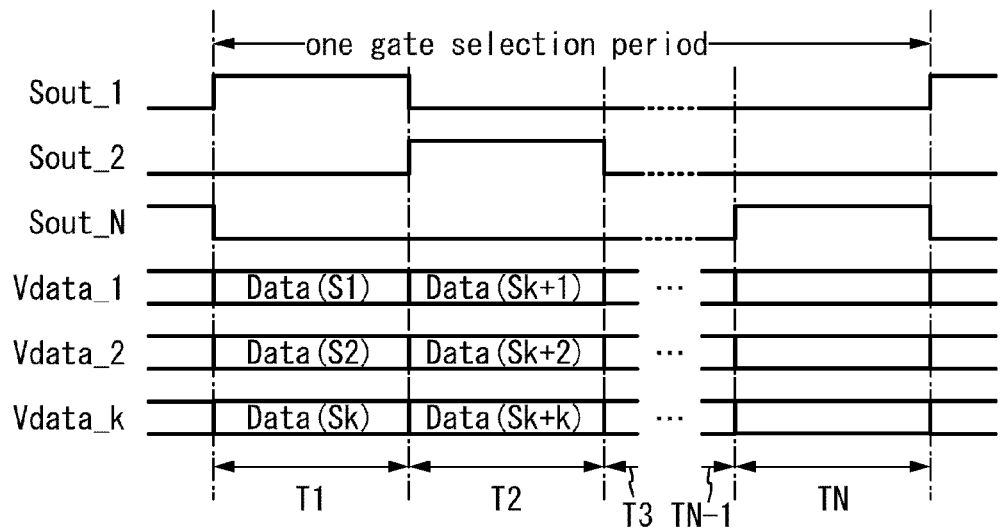

Next, the operation of the signal line driver circuit in FIG. 6A is described with reference to a timing chart in FIG. 6B. FIG. 6B illustrates examples of signals Sout_1 to Sout_N and signals Vdata_1 to Vdata_k. The signals Sout_1 to Sout_N are examples of signals outputted from the shift register 5601. The signals Vdata_1 to Vdata_k are examples of signals input to the wirings 5604_1 to 5604_*k*. Note that one operation period of the signal line driver circuit corresponds to one gate selection period in a display device. For example, one gate selection period is divided into periods T1 to TN. Each of the periods T1 to TN is a period during which the video signal data (DATA) is written to a pixel in a selected row.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_*k* are turned on, so that the wirings 5604_1 to 5604_*k* and the signal lines S1 to Sk are brought into conduction. At this time, Data (S1) to Data (Sk) are inputted to the wirings 5604_1 to 5604_*k*, respectively. The Data (S1) to Data (Sk) are written to pixels in first to k-th columns in a selected row through the thin film transistors 5603_1 to 5603_*k*, respectively. In this manner, in the periods T1 to TN, the video signal data (DATA) is sequentially written to the pixels in the selected row by k columns.

When the video signal data (DATA) is written to pixels by a plurality of columns as described above, the number of video signal data (DATA) or the number of wirings can be reduced. Thus, the number of connections with an external circuit can be reduced. Further, writing time can be extended when video signals are written to pixels by a plurality of columns; thus, insufficient writing of video signals can be prevented.

The structure of a scan line driver circuit is described. The scan line driver circuit may include a shift register, a buffer, or the like. Additionally, the scan line driver circuit may include a level shifter in some cases. In the scan line driver circuit, when a clock signal (CLK) and a start pulse signal (SP) are inputted to the shift register, a selection signal is generated. The selection signal generated is buffered and amplified in the buffer, and the resulting signal is supplied to a corresponding scan line. Gate electrodes of transistors in pixels of one line are connected to the scan line. Since the transistors in the pixels of one line have to be turned on all at once, a buffer which can supply a large amount of current is used.

The control circuit described in the above embodiment is employed in the driver circuit in this embodiment, so that the threshold voltage is compensated in accordance with the degree of change in the threshold voltage. Accordingly, an increase in the power consumption or malfunctions can be suppressed.

This embodiment can be combined with any of the structures described in the other embodiments as appropriate.

Embodiment 4

In this embodiment, examples of electronic devices each including the display device described in the above embodiment in a display portion will be described.

The content (or part of the content) described in each drawing in the above embodiment can be applied to a variety of electronic devices. Specifically, it can be applied to display portions of electronic devices. As such electronic devices, there are cameras such as video cameras and digital cameras, goggle-type displays, navigation systems, audio reproducing devices (e.g., car audio equipment or audio component sets), computers, game machines, portable information terminals (e.g., mobile computers, mobile phones, portable game machines, or e-book readers), image reproducing devices provided with recording media (specifically devices which reproduce the content of recording media such as digital versatile discs (DVDs) and have displays for displaying the reproduced images), and the like.

Figure 7A:
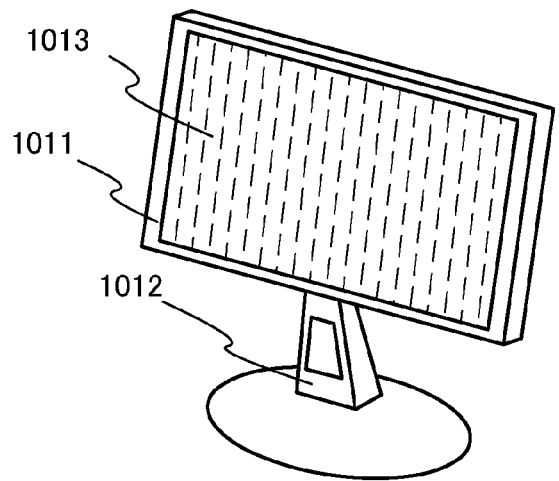
FIGS. 7A to 7C are views each illustrating an example of a display device.

FIG. 7A illustrates a display, which include a housing 1011, a support 1012, and a display portion 1013. The display illustrated in FIG. 7A has a function of displaying a variety kinds of information (e.g., still images, moving images, and text images) on the display portion. Note that the display illustrated in FIG. 7A is not limited to having this function. The display illustrated in FIG. 7A can have a variety of functions.

Figure 7B:
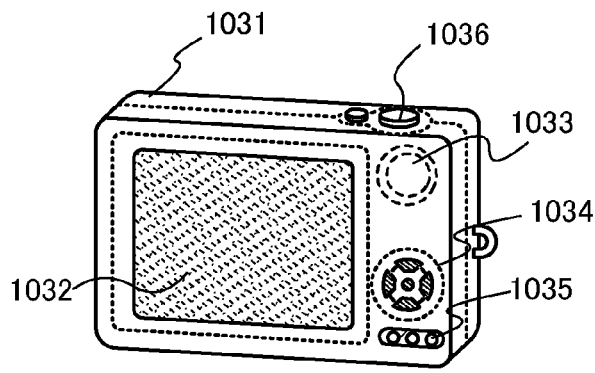

FIG. 7B illustrates a camera, which includes a main body 1031, a display portion 1032, an image reception portion 1033, operation keys 1034, an external connection port 1035, and a shutter button 1036. The camera illustrated in FIG. 7B has a function of taking still images and may have a function of taking moving images. Note that the camera illustrated in FIG. 7B is not limited to having these functions. The camera illustrated in FIG. 7B can have a variety of functions.

Figure 7C:
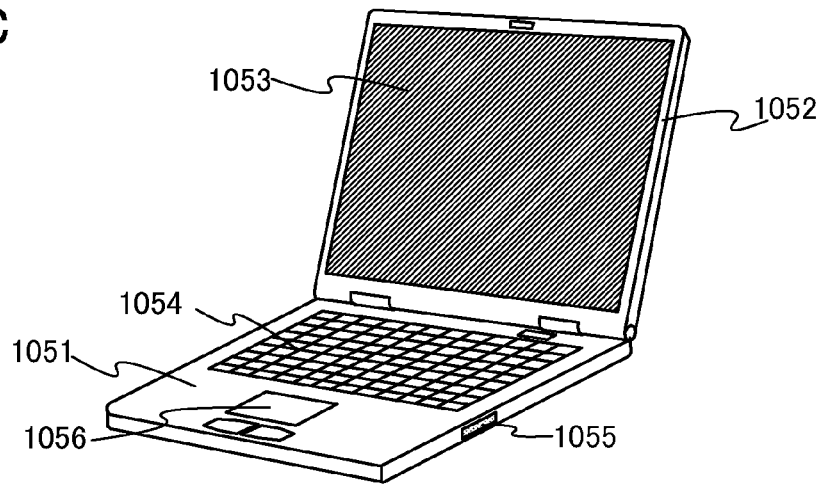

FIG. 7C illustrates a computer, which includes a main body 1051, a housing 1052, a display portion 1053, a keyboard 1054, an external connection port 1055, and a pointing device 1056. The computer illustrated in FIG. 7C has a function of displaying a variety kinds of information (e.g., still images, moving images, and text images) on the display portion. Note that the computer illustrated in FIG. 7C is not limited to having this function. The computer illustrated in FIG. 7C can have a variety of functions.

The display device described in the above embodiment is used in the display portion in this embodiment, so that the threshold voltage is compensated in accordance with the degree of change in the threshold voltage. Accordingly, an increase in the power consumption or malfunctions can be suppressed, which leads to an electronic device with less power consumption and higher display quality.

This embodiment can be combined with any of the structures described in the other embodiments as appropriate.

Example

Figure 11:
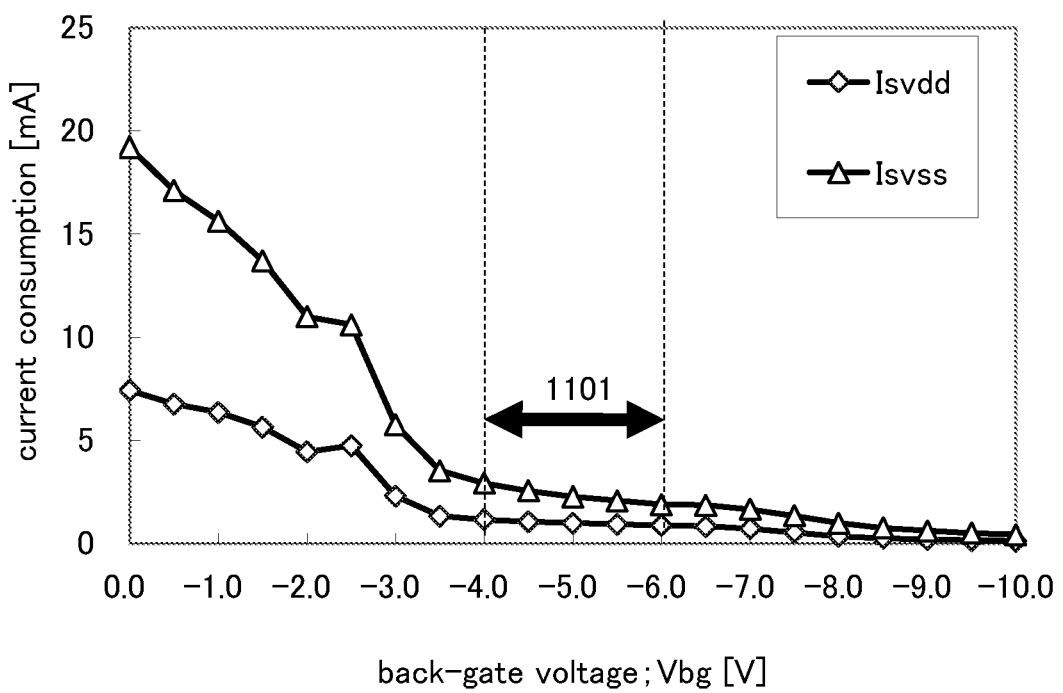
FIG. 11 is a graph illustrating relations between a back-gate voltage and current consumption.

FIG. 11 is a graph in which the horizontal axis represents the back-gate voltage Vbg which applied to the second gate in the wiring connected to the driver circuit, and the vertical axis represents the current consumption in the wirings for supplying the high power supply potential Vdd and the low power supply potential Vss. In FIG. 11, the rhombuses represent the current consumption (hereinafter referred to as Isvdd) in the wiring for supplying the high power supply potential, and the triangles represent the current consumption (hereinafter referred to as Isvss) in the wiring for supplying the low power supply potential. The structure of the driver circuit which supplies the high power supply potential Vdd and the low power supply potential Vss in FIG. 11 corresponds to the structure of the driver circuit illustrated in FIGS. 3A to 3C.

As shown in FIG. 11, the current consumption is decreased as the back-gate voltage Vbg is shifted toward the minus side smaller than 0 V. The Isvdd and the Isvss are greatly decreased in the range of from −3.5 V to −2.0 V in FIG. 11. The threshold voltage of the transistor included in the driver circuit is shifted and the depletion transistor is changed into the enhancement transistor, so that the current consumption is decreased. When the transistor was changed into the enhancement transistor, the leakage current was decreased. When the current consumption was checked with a waveform of pulse output of the driver circuit, the driver circuit operated normally in the range of from −7.0 V to −3.5 V (preferably −6.0 V to −4.0 V: the range denoted by an arrow 1101 in FIG. 11). In that case, in the back-gate voltage setting treatment described in Embodiment 1 with reference to FIG. 1 and FIG. 2, the strength of the reference value A is set in advance at 1.5 mA when the Isvdd is used, and set at 4.0 mA when the Isvss is used. When the back-gate voltage Vbg is −3.5 V, the strength X of the current value is smaller than the strength A of the reference value; thus, the back-gate voltage Vbg can be set at −3.5 V.

Note that the structure in which the decrease in the current consumption is judged in the back-gate voltage setting treatment described in Embodiment 1 with reference to FIG. 1 and FIG. 2 is described in this example; however, as seen from FIG. 11, in order to realize the normal operation of the driver circuit with more certainty, it is preferable that an extra voltage (a margin) of about −1.5 V be added to the value of the back-gate voltage Vbg that is judged that the current consumption is decreased so that the back-gate voltage Vbg be −5.0 V.

As seen from FIG. 11, when the application value of the back-gate voltage is smaller than or equal to −7.0 V, the current consumption is further decreased. The decrease in the current consumption is caused by the transistor in which switching cannot be performed. When the waveform of pulse output of the driver circuit was checked, the desired pulse waveform was not obtained in the case where the application value of the back-gate voltage is smaller than or equal to −7.0 V. Accordingly, when the back-gate voltage is set, it is preferable to apply a high voltage in advance, for example, 0 V in the case of FIG. 11, as an initial value of the back-gate voltage.

This example can be combined with any of the structures described in the embodiments as appropriate.

This application is based on Japanese Patent Application serial no. 2009-249631 filed with Japan Patent Office on Oct. 30, 2009, the entire contents of which are hereby incorporated by reference.

The invention claimed is:

1. A circuit comprising:
an operation circuit comprising a first transistor and a second transistor;
a current detection circuit operationally connected to the operation circuit, the current detection circuit configured to detect a current value of current flowing in at least one of the first transistor and the second transistor;
a judgment circuit operationally connected to the current detection circuit, the judgment circuit configured to compare the current value with a reference value;
a memory circuit operationally connected to the judgment circuit; and
a voltage output circuit operationally connected to the judgment circuit through the memory circuit,
wherein each of the first transistor and the second transistor comprises:
a first gate;
a first insulating layer over the first gate;
a semiconductor layer over the first insulating layer;
a second insulating layer over the semiconductor layer; and
a second gate over the second insulating layer,
wherein a first signal configured to control switching of at least the one of the first transistor and the second transistor is inputted to the first gate of at least the one of the first transistor and the second transistor,
wherein a second signal configured to control a threshold voltage of the first transistor and a threshold voltage of the second transistor is inputted to the second gate of the first transistor and the second gate of the second transistor,
wherein the memory circuit is configured to store a third signal when the current value is larger than the reference value,
wherein the voltage output circuit is configured to output the third signal to the second gate of the first transistor and the second gate of the second transistor,
wherein a voltage of the third signal is smaller than a voltage of the second signal by a constant value, and
wherein the first transistor and the second transistor have a same conductivity type.

2. The circuit according to claim 1,
wherein the first transistor and the second transistor are n-channel transistors.

3. The circuit according to claim 1,
wherein the first transistor and the second transistor are p-channel transistors.

4. The circuit according to claim 1,
wherein the semiconductor layer comprises an oxide semiconductor.

5. A display device comprising the circuit according to claim 1.

6. An electronic device comprising the display device according to claim 5.

7. A method for operating a circuit comprising a first transistor and a second transistor each comprising a first gate and a second gate, said method comprising:
inputting a first signal configured to control switching of at least one of the first transistor and the second transistor in an operation circuit to the first gate of at least the one of the first transistor and the second transistor;
inputting a second signal for controlling configured to control a threshold voltage of the first transistor and a threshold voltage of the second transistor to the second gate of the first transistor and the second gate of the second transistor;
performing a first detection of a first current value of current flowing in the one of the first transistor and the second transistor by inputting the first signal and the second signal;
comparing the first current value with a reference value;
inputting a third signal to the second gate of the first transistor and the second gate of the second transistor when the first current value is larger than the reference value; and
performing a second detection of a second current value of current flowing in the one of the first transistor and the second transistor by inputting the first signal and the third signal,
wherein a voltage of the third signal is smaller than a voltage of the second signal by a constant value so that the second current value is smaller than the first current value, and
wherein the first transistor and the second transistor have a same conductivity type.

8. The method for operating the circuit according to claim 7,
wherein the first transistor and the second transistor are n-channel transistors.

9. The method for operating the circuit according to claim 7,
wherein the first transistor and the second transistor are p-channel transistors.

10. The method for operating the circuit according to claim 7,
wherein the third signal is supplied from a back-gate voltage control circuit to the operation circuit,
wherein the back-gate voltage control circuit comprises:
a current detection circuit performing the first detection and the second detection;
a judgment circuit performing the comparing process;
a memory circuit configured to store the third signal; and
a voltage output circuit inputting the third signal to the operation circuit.

11. The method for operating the circuit according to claim 7,
wherein a semiconductor layer of the first transistor and the second transistor each comprise an oxide semiconductor.

12. The method for operating the circuit according to claim 7,
wherein a display device comprises the circuit.

13. The method for operating the circuit according to claim 12,
wherein an electronic device comprises the display device.

14. The method for operating the circuit according to claim 7, further comprising:
comparing the second current value with the reference value; and
inputting a fourth signal to the second gate of the first transistor and the second gate of the second transistor when the second current value is larger than the reference value,
wherein the third signal is kept inputting to the second gate of the first transistor and the second gate of the second transistor when the second current value is smaller than the reference value.

15. A method for controlling a threshold voltage of a first transistor and a threshold voltage of a second transistor, each of the first transistor and the second transistor being provided in an operation circuit and comprising a first gate and a second gate, said method comprising:
- inputting a power supply voltage to the operation circuit;
- inputting a first signal to the second gate of the first transistor and the second gate of the second transistor;
- performing a first detection of a first current value of current flowing in the operation circuit after inputting the power supply voltage and the first signal; and
- comparing the first current value with a reference value;
- inputting a second signal to the second gate of the first transistor and the second gate of the second transistor when the first current value is larger than the reference value; and
- performing a second detection of a second current value of current flowing in the operation circuit after inputting the power supply voltage and the second signal,
- wherein a voltage of the second signal is smaller than a voltage of the first signal by a constant value so that the second current value is smaller than the first current value, and
- wherein the first transistor and the second transistor have a same conductivity type.

16. The method for controlling a threshold voltage of the first transistor and a threshold voltage of the second transistor according to claim 15,
- wherein the first transistor and the second transistor are n-channel transistors.

17. The method for controlling a threshold voltage of the first transistor and a threshold voltage of the second transistor according to claim 15,
- wherein the first transistor and the second transistor are p-channel transistors.

18. The method for controlling a threshold voltage of the first transistor and a threshold voltage of the second transistor according to claim 15,
- wherein the second signal is supplied from a back-gate voltage control circuit to the operation circuit,
- wherein the back-gate voltage control circuit comprises:
    - a current detection circuit performing the first detection and the second detection;
    - a judgment circuit performing the comparing process;
    - a memory circuit configured to store the second signal; and
    - a voltage output circuit inputting the second signal to the operation circuit.

19. The method for controlling a threshold voltage of the first transistor and a threshold voltage of the second transistor according to claim 15,
- wherein a semiconductor layer of the first transistor and the second transistor each comprise an oxide semiconductor.

20. The method for controlling a threshold voltage of the first transistor and a threshold voltage of the second transistor according to claim 15,
- wherein a display device comprises the operation circuit.

21. The method for controlling a threshold voltage of the first transistor and a threshold voltage of the second transistor according to claim 20,
- wherein an electronic device comprises the display device.

22. The method for controlling a threshold voltage of the first transistor and a threshold voltage of the second transistor according to claim 15, further comprising:
- comparing the second current value with the reference value; and
- inputting a third signal to the second gate of the first transistor and the second gate of the second transistor when the second current value is larger than the reference value,
- wherein the second signal is kept inputting to the second gate of the first transistor and the second gate of the second transistor when the second current value is smaller than the reference value.

\* \* \* \* \*

UNITED STATES PATENT AND TRADEMARK OFFICE
CERTIFICATE OF CORRECTION

| | | |
|---|---|---|
| PATENT NO. | : 8,674,979 B2 | Page 1 of 1 |
| APPLICATION NO. | : 12/912059 | |
| DATED | : March 18, 2014 | |
| INVENTOR(S) | : Masahiko Hayakawa | |

It is certified that error appears in the above-identified patent and that said Letters Patent is hereby corrected as shown below:

In the Specification

At column 10, line 45, "102" should be --10_2--;

In the Claims

In claim 7, column 18, line 1, "second signal for controlling configured" should be --second signal configured--.

Signed and Sealed this
Twenty-second Day of July, 2014

Michelle K. Lee
*Deputy Director of the United States Patent and Trademark Office*